United States Patent
Park et al.

(10) Patent No.: US 7,378,292 B2
(45) Date of Patent: May 27, 2008

(54) METHOD OF FABRICATING SEMICONDUCTOR OPTICAL DEVICE

(75) Inventors: Moon Ho Park, Daejeon (KR); Sahng Gi Park, Daejeon (KR); Su Hwan Oh, Daejeon (KR); Yong Soon Baek, Daejeon (KR); Kwang Ryong Oh, Daejeon (KR); Gyung Ock Kim, Seoul (KR); Sung Bock Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 408 days.

(21) Appl. No.: 11/293,615

(22) Filed: Dec. 2, 2005

(65) Prior Publication Data

US 2006/0189016 A1    Aug. 24, 2006

(30) Foreign Application Priority Data

Dec. 9, 2004   (KR) ................. 10-2004-0103665

(51) Int. Cl.
*H01L 21/00* (2006.01)
(52) U.S. Cl. .............. 438/31; 257/98; 372/43.01; 385/144
(58) Field of Classification Search .......... 438/31; 372/43.01; 385/144; 257/98
See application file for complete search history.

(56) References Cited

U.S. PATENT DOCUMENTS 6,236,794 B1   5/2001  Mallecot et al. ........... 385/132
6,239,490 B1 *  5/2001  Yamada et al. ............ 257/745
6,815,736 B2 * 11/2004  Mascarenhas ............. 257/201

OTHER PUBLICATIONS

'Monolithically Integrated Semiconductor LED-Amplifier for Applications as Transceivers in Fiber Access Systems' Liou et al., IEEE Photonics Technology Letters, vol. 8, No. 6, Jun. 1996, pp. 800-802.

'Monolithic series-connected 1.55 μm segmented-ridge lasers' Getty et al., Electronic Letters, vol. 35, No. 15, Jul. 1999, pp. 1257-1258.

* cited by examiner

*Primary Examiner*—Carl Whitehead, Jr.
*Assistant Examiner*—Colleen E Rodgers
(74) *Attorney, Agent, or Firm*—Ladas & Parry LLP

(57) ABSTRACT

Provided is a method of fabricating a semiconductor optical device for use in a subscriber or a wavelength division multiplexing (WDM) optical communication system, in which a laser diode (LD) and a semiconductor optical amplifier (SOA) are integrated in a single active layer. The laser diode (LD) and the semiconductor optical amplifier (SOA) are optically connected to each other, and electrically insulated from each other by ion injection, whereby light generated from the LD is amplified by the SOA to provide low oscillation start current and high intensity of output light when current is individually injected through each electrode.

12 Claims, 12 Drawing Sheets

METHOD OF FABRICATING SEMICONDUCTOR OPTICAL DEVICE

CROSS-REFERENCE TO RELATED APPLICATION

This application claims priority to and the benefit of Korean Patent Application No. 2004-103665, filed Dec. 9, 2004, the disclosure of which is incorporated herein by reference in its entirety.

BACKGROUND

1. Field of the Invention

The present invention relates to a method of fabricating a semiconductor optical device for use in an optical subscriber or a wavelength division multiplexing (WDM) optical communication system and, more particularly, to a method of fabricating a semiconductor optical device that a laser diode (LD) and a semiconductor optical amplifier (SOA) are integrated.

2. Discussion of Related Art

A typical optical communication system uses a light emitting diode (LED), a Fabry-Perot laser diode (FP-LD), a distributed feedback laser diode (DFB-LD), and so on, as a light source. The LD of 1.3 µW and 1.55 µW have an optical power of about 20 mW and an oscillation start current characteristic of about 10~20 mA. However, it is difficult to fabricate the PF-LD to have an optical power of not less than 30 mW and an oscillation start current characteristic of not more than 10 mA.

A wavelength division multiplexing-passive optical network (WDM-PON) type of optical network unit (ONU) may compose a light source for an optical subscriber in a manner of slicing a spectrum using an arrayed waveguide grating (AWG) (J. K. Park et al, "Monolithically Integrated Semiconductor LED-Amplifier for Applications as Transceivers in Fiber Access Systems", IEEE Photonics Technology Letters, Vol. 8 No. 6, pp. 800-802, June, 1996). Characteristics of the light source required in the manner should have an optical output spectrum having a broadband width of not less than several 10 nm and an optical output intensity of not less than several mW.

From the viewpoint of the problems, the light source such as LED, FP-PD and DFB-LD used up to date have the following disadvantages.

First, while the LED may be readily fabricated and applicable to the broadband, since the intensity of output light is low, for example, several hundreds of µW or less, a system of an optical subscriber additionally requires an optical amplifier. Therefore, when the LED is used as the light source, the system becomes complicated and its price becomes high.

Second, while FP-LD and DFB-LD have a good output light of 10 mW, since they have a light output of a narrowband, optical beat interference (OBI) to an adjacent light source is generated in the subscriber system.

SUMMARY OF THE INVENTION

The present invention, therefore, solves aforementioned problems associated with conventional devices by providing a method of fabricating a semiconductor optical device having low oscillation start current and high output light intensity.

In an exemplary embodiment of the present invention, a method of fabricating a semiconductor optical device includes: after forming a buffer layer, an active layer and a passivation layer on a substrate, forming a plurality of first patterns having a stripe shape on a passivation layer; patterning the passivation layer, the active layer and the buffer layer using the first patterns as masks; forming a clad layer and an ohmic contact layer on an entire surface of the resultant structure, after removing the first pattern; forming a plurality of second patterns having a stripe shape on the ohmic contact layer of an optical amplifier region and a laser diode region, respectively; forming a current blocking layer on the ohmic contact layer and the clad layer of a portion exposed through an ion injection process using the second patterns as masks; removing the ohmic contact layer of a portion, in which ions are injected, after removing the second patterns, and forming an oxide pattern to expose the ohmic contact layer of a portion, in which ions are not injected; forming first metal electrodes on the exposed ohmic contact layer of the optical amplifier region and the laser diode region, respectively; and forming a second metal electrode on a bottom surface of the substrate.

The active layer may include a first SCH layer, a quantum well layer and a second SCH layer, and the quantum well layer may be formed in a multi-layered structure that an unstrained InGaAsP barrier layer is inserted between InGaAsP strained well layers.

The first pattern may be formed perpendicularly to a light output surface of the optical amplifier or to have a predetermined angle of slope, and the predetermined angle may be 5 to 10°.

The current blocking layer may be formed on the ohmic contact layer and the clad layer of a boundary between the optical amplifier region and the laser diode region during the ion injection process.

The method may further include etching the bottom surface of the substrate to a predetermined thickness before forming the second metal electrode, and coating an anti-reflection layer at the light output surface of the optical amplifier after forming the second metal electrode.

BRIEF DESCRIPTION OF THE DRAWINGS

The above and other features of the present invention will be described in reference to certain exemplary embodiments thereof with reference to the attached drawings in which.

DETAILED DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

FIGS. 1 to 8 are cross-sectional views and perspective views illustrating a method of fabricating a semiconductor optical device in accordance with an exemplary embodiment of the present invention.

Figure 1A:
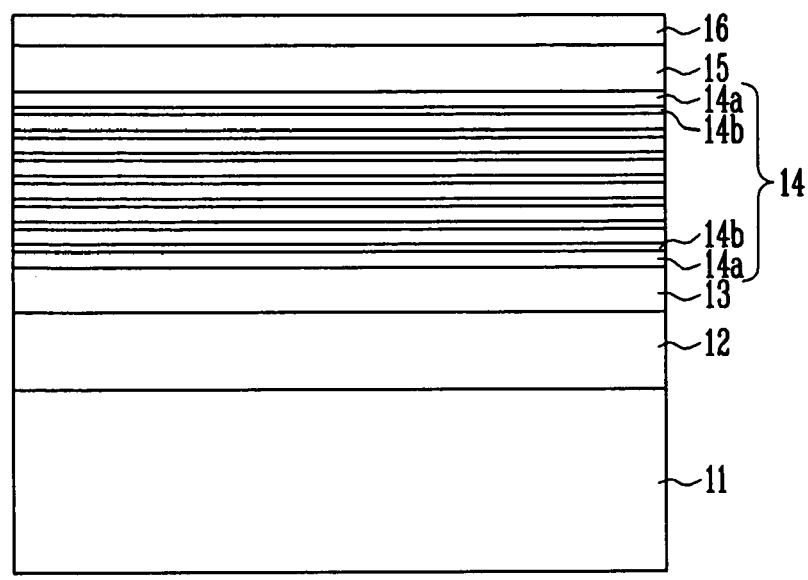
FIGS. 1 to 8 are cross-sectional views and perspective views illustrating a method of fabricating a semiconductor optical device in accordance with an exemplary embodiment of the present invention.
Figure 1B:
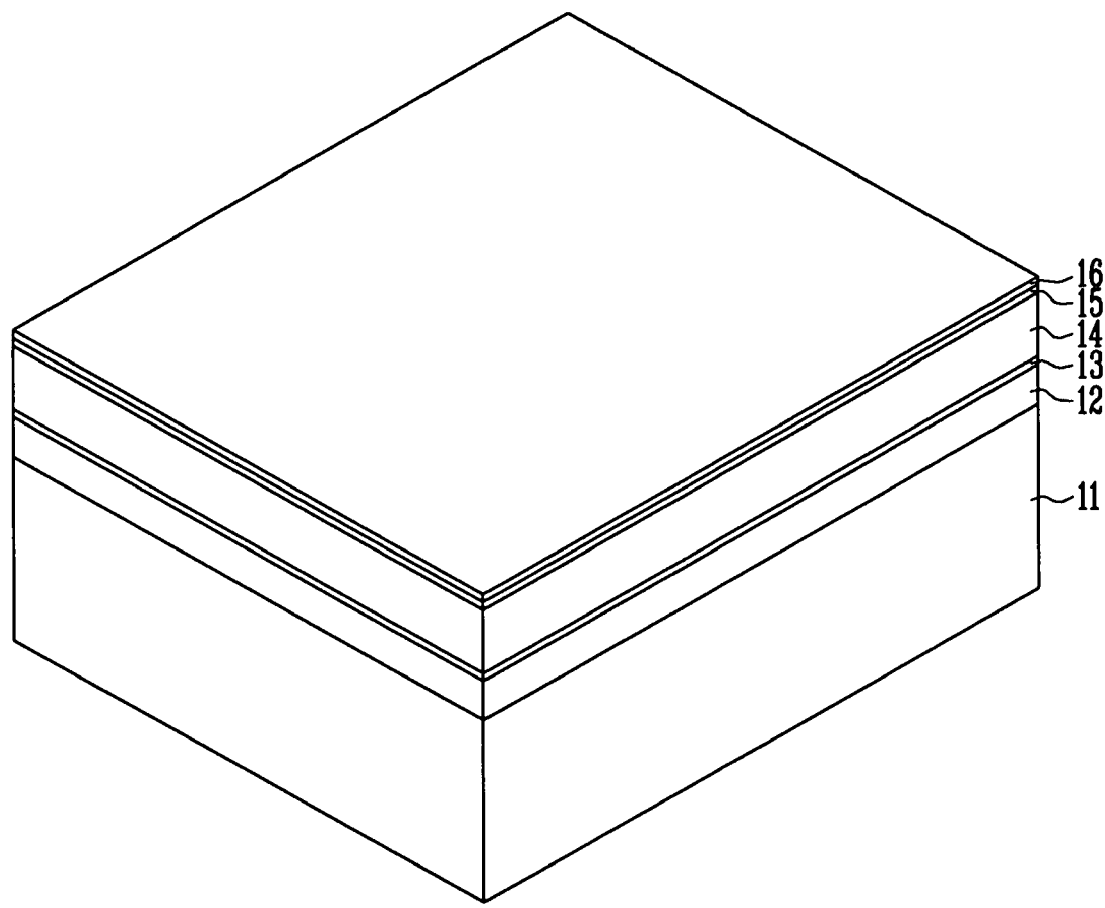

Referring to FIGS. 1A and 1B, after forming a buffer layer 12 on an n-InP substrate 11, an active layer including a separate confinement heterostructure (SCH) layer 13, a quantum well layer 14 and an SCH layer 15 is formed on the buffer layer 12, and a passivation layer 16 is formed on the SCH layer 15.

The buffer layer 12 is formed to have $\lambda=1.3$ µm and a thickness of 0.3 µm using a metal organic chemical vapor deposition (MOCVD) method, and the SCH layer 13 is formed to have $\lambda=1.3$ µm and a thickness of 0.07 µm. The quantum well layer 14 is formed to have a multi-layered structure that an unstrained InGaAsP barrier layer 14b is inserted between 0.8% InGaAsP strained well layers 14a. The InGaAsP strained well layer 14a is formed to have $\lambda=1.68$ µm and a thickness of 11.5 nm, and the unstrained InGaAsP layer 14b is formed to have $\lambda=1.68$ µm and a thickness of 11.5 nm. The SCH layers 13 and 15 are formed to have $\lambda=1.3$ µm and a thickness of 0.07 µm. The passivation layer 16 is formed of a p-InP layer having a thickness of 0.1 µm.

Figure 2:
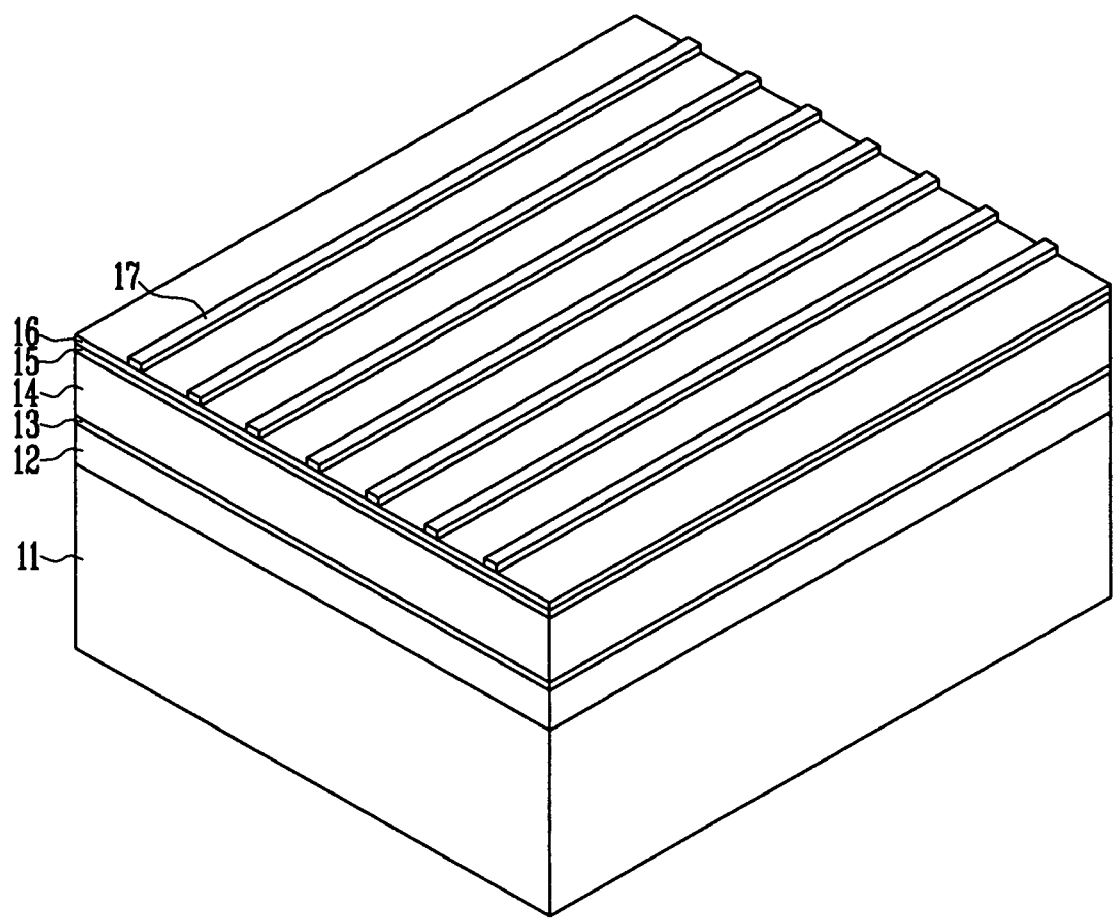

Referring to FIG. 2, after forming an oxide layer 17 having a thickness of 0.2 µm on the passivation layer 16 using a plasma enhanced CVD (PECVD) method, a photosensitive layer pattern (not shown) having a stripe shape is formed on the oxide layer 17 using a photolithography process. The oxide layer 17 is formed of oxide including SiOx, and SiNx, and the stripe shaped photosensitive layer pattern is formed to have a line width of 2 µm in the direction of 110, which is formed to have a predetermined angle of slope to the light output surface, for example, perpendicular, or about 5~10°, preferably, about 7°.

Figure 3:
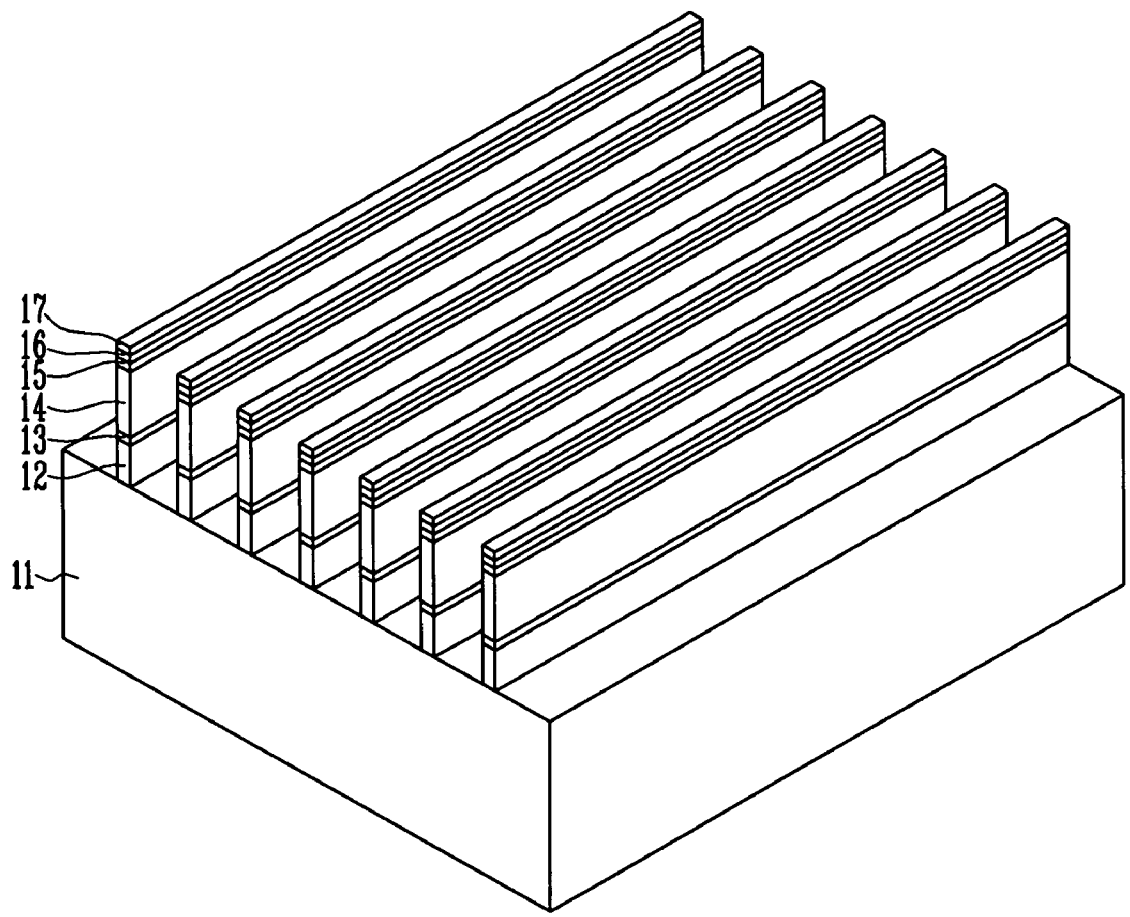

Referring to FIG. 3, the oxide layer 17 is patterned using the photosensitive layer pattern as a mask, and then, the passivation layer 16, the SCH layer 15, the quantum well layer 14, the SCH layer 13, and the buffer layer 12 are sequentially patterned using the patterned oxide layer 17 as a mask. At this time, the substrate 11 may be etched to a depth of several hundreds of Å to entirely expose the buffer layer 12. In order to remove a surface layer damaged during the etching process, after cleaning the surface layer using sulfuric acid solution for 2 minutes, the damaged surface layer is etched to a depth of about 10 nm for 30 seconds using $HBr:H_2O_2:H_2O=8:2:100$ solution. The oxide layer 17 is etched using an MERIE method, and the passivation layer 16, the SCH layer 15, the quantum well layer 14, the SCH layer 13, and the buffer layer 12 are etched using a dry etching method.

Figure 4A:
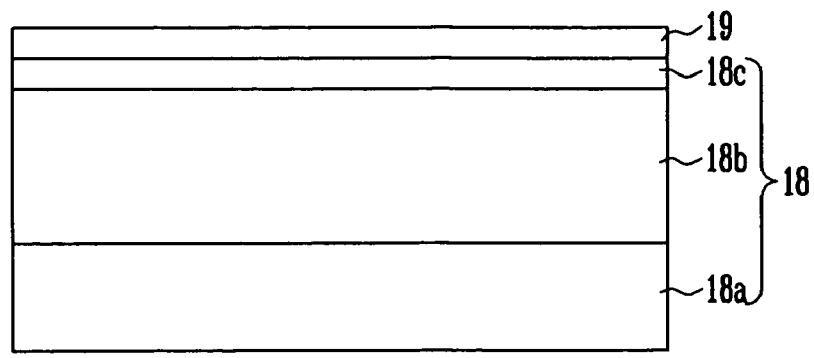
Figure 4B:
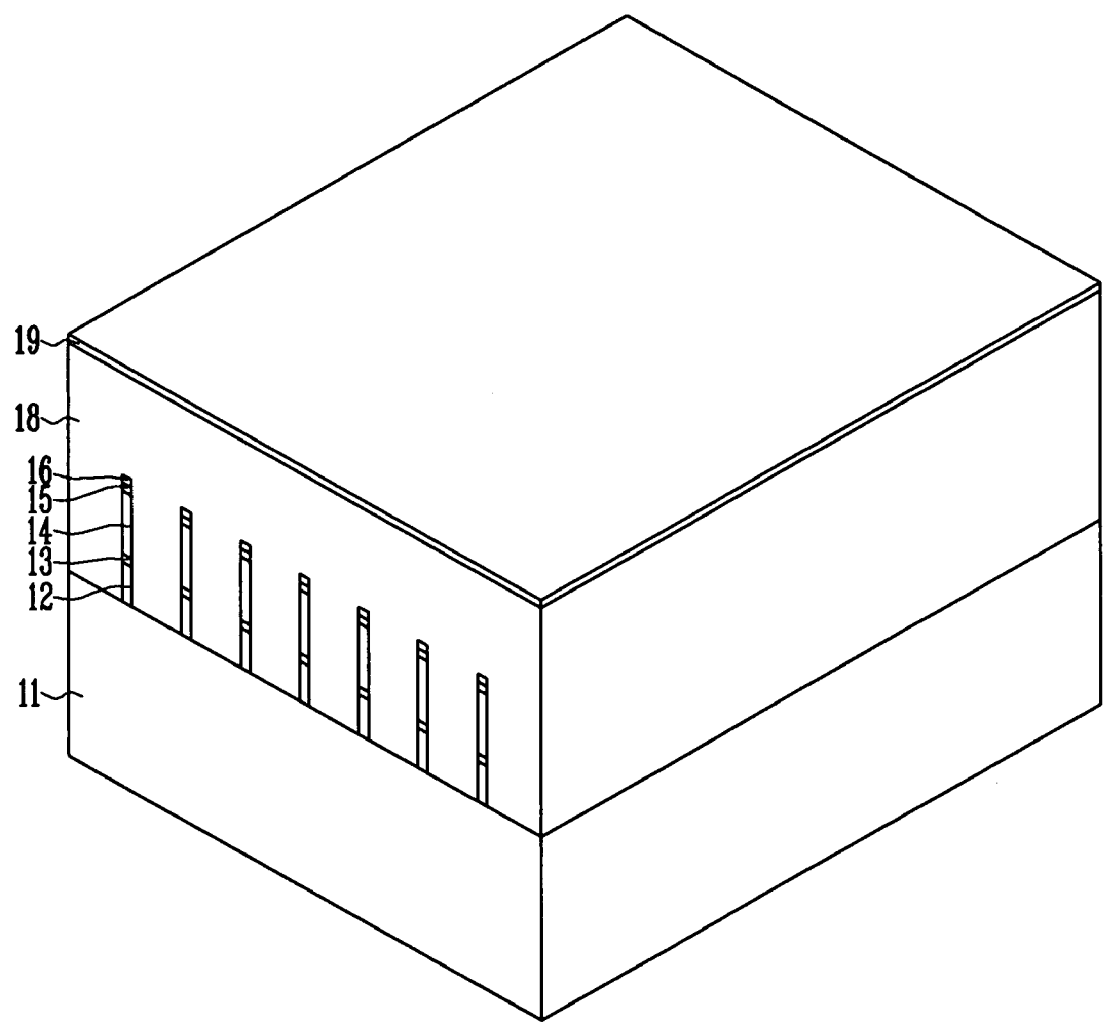

Referring to FIGS. 4A and 4B, after removing the remaining oxide layer 17, a p-InP clad layer 18 and a p-InGaAs ohmic contact layer 19 are deposited on the entire surface of the resultant structure using the MOCVD method to form a buried ridge structure (BRS). An InP layer (not shown) is formed on the p-InGaAs ohmic contact layer 19 to have a thickness of 0.2 µm to protect the surface during the following ion injection process and lithography process.

As shown in FIG. 4A, the p-InP clad layer 18 includes p-InP layers 18a, 18b and 18c having different thickness and doping concentration in order to minimize ohmic resistance and influence of Zn diffused in the active layer. At this time, the thickness and the doping concentration of the p-InP layers 18a, 18b and 18c are optimized to have low oscillation start current and high light output characteristics, for example, the p-InP layer 18a has a thickness of 0.7 µm and a doping concentration of $7\times10^{17}$, the p-InP layer 18b has a thickness of 1.0 µm and a doping concentration of $1\times10^{18}$, and the p-InP layer 18c has a thickness of 0.3 µm and a doping concentration of $2\times10^8$.

Figure 5:
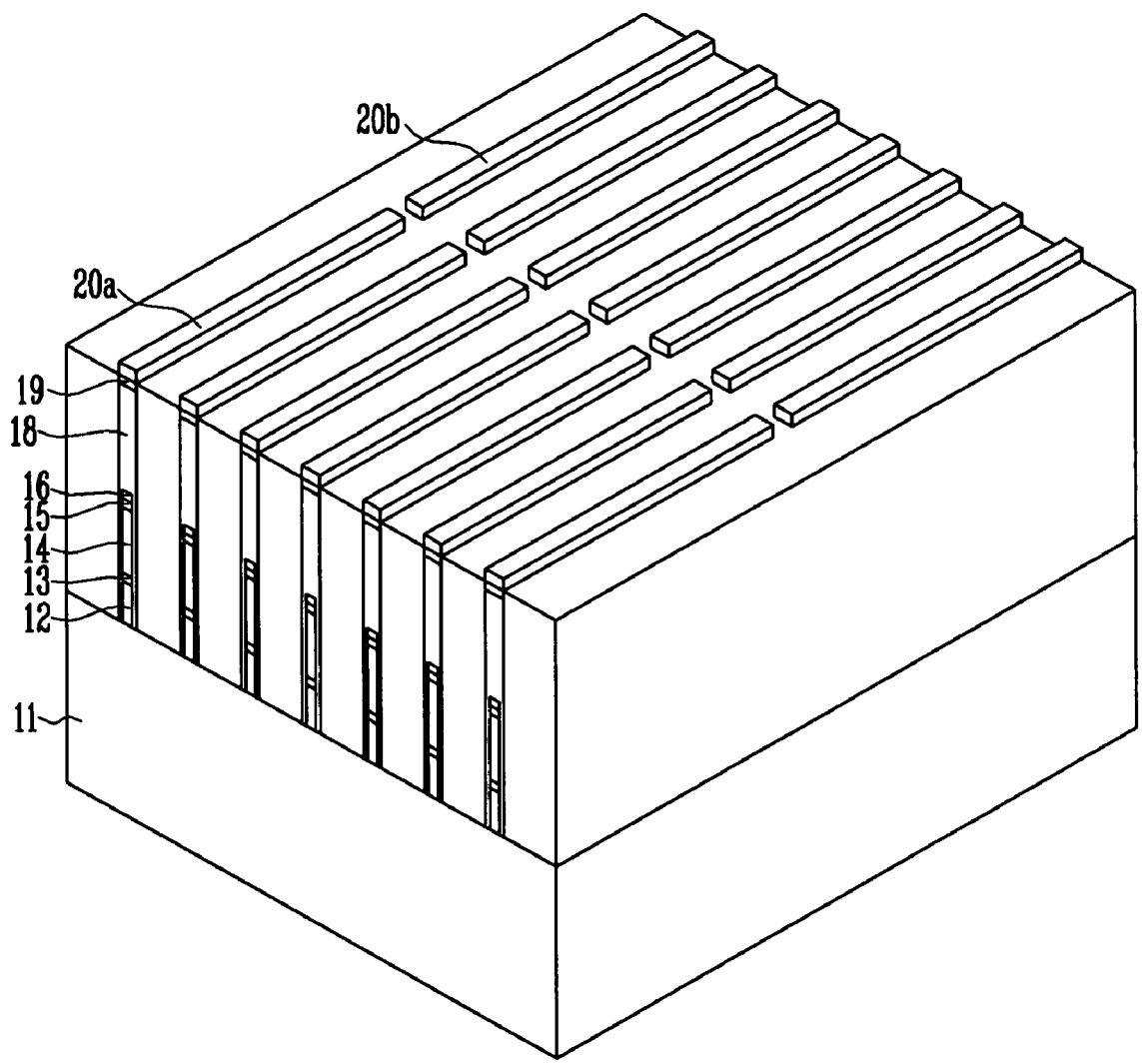

Referring to FIG. 5, when the BRS structure is formed, ions are injected into the active layer to limit an injection current. Therefore, in order to protect the active layer during the ion injection process, stripe shaped photosensitive layer patterns 20a and 20b are formed on the p-InGaAs ohmic contact layer 19 to have a thickness of 10 µm and a width of 10 µm. At this time, the photosensitive layer pattern 20a is formed in a semiconductor optical amplifier (SOA) region, the photosensitive layer pattern 20 b is formed in a laser diode (LD) region, and the p-InGaAs ohmic contact layer 19 between the SOA region and the LD region is exposed.

Ions are injected into the p-InGaAs ohmic contact layer 19 and the p-InP clad layer 18 between the photosensitive layer patterns 20a and 20b through the ion injection process using the photosensitive layer patterns 20a and 20b as masks. At this time, since photosensitive layer patterns 20a and 20b are spaced apart from each other by a boundary between the SOA region and the LD region, the ions are injected into the boundary between the SOA region and the LD region to form a current blocking layer for electrically insulating the two regions.

In the embodiment, mostly, positive H ions are injected by an accelerated voltage of about several hundreds of KeV and a dose of about $10^{14}$ ion/cm$^2$. The kind, the accelerated voltage and the dose of the ion can be optimized depending on the thickness of the p-InP clad layer 18 and required conditions.

Figure 6:
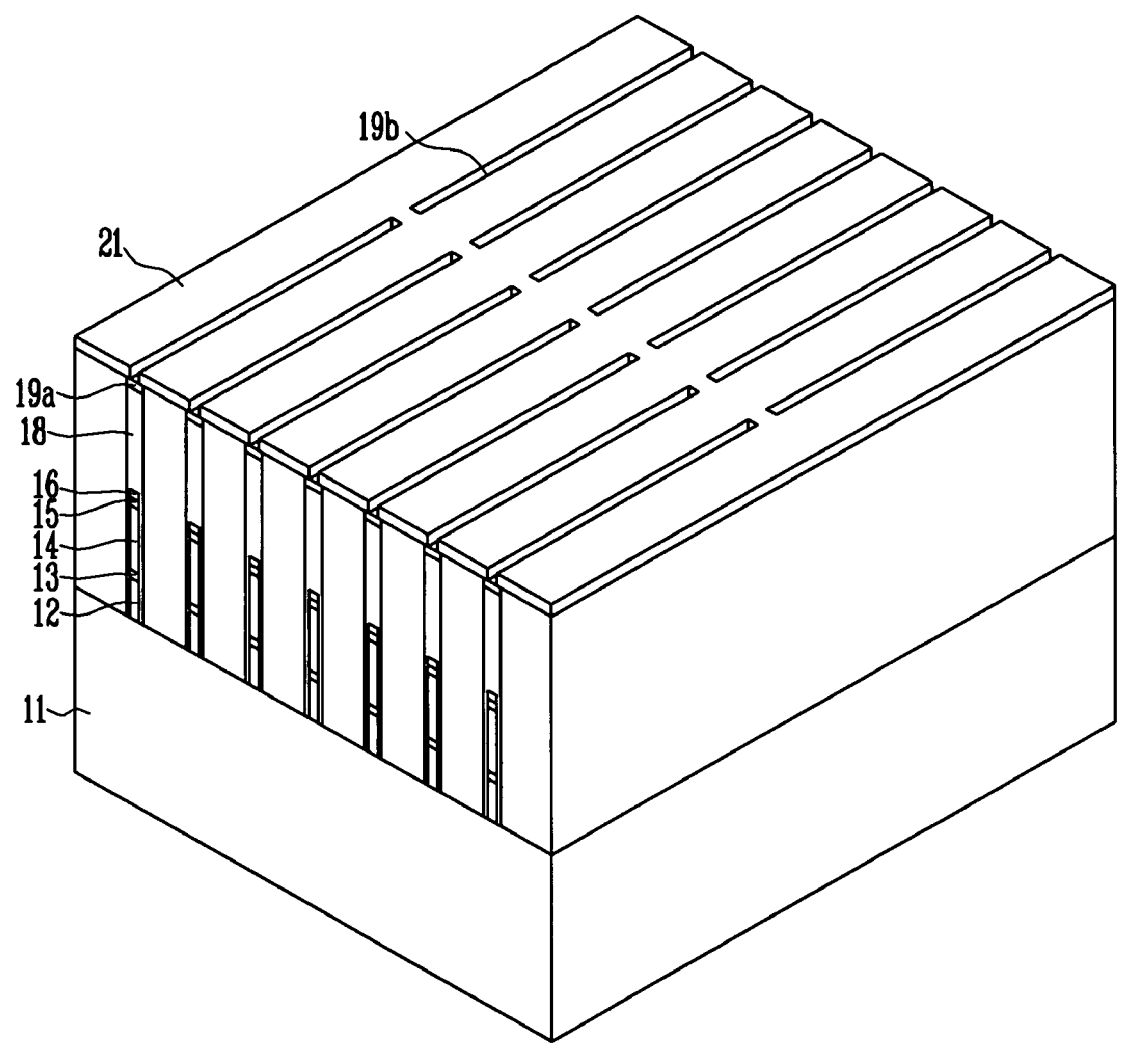

Referring to FIG. 6, after boiling the photosensitive layer patterns 20a and 20b using ACT-1 solution, the layers are removed through an ashing process using plasma. Then, the p-InGaAs ohmic contact layer 19 of the ion injected portion is removed by etching using $H_3PO_4:HCl=85:15$ solution for 2 minutes. The remaining photosensitive layer patterns are also entirely removed during the process.

Then, after depositing the oxide layer 21 on the entire surface of the resultant structure, the oxide layer 21 deposited on the p-InGaAs ohmic layer 19 through an etching process using a predetermined mask is removed using an MERIE method to expose the p-InGaAs ohmic contact layers 19a and 19b of the SOA region and the LD region. The p-InGaAs ohmic contact layers 19a and 19b that no ion is injected becomes a current injection region, and the p-InP clad layer 18 that ions are injected becomes a current blocking region.

Figure 7:
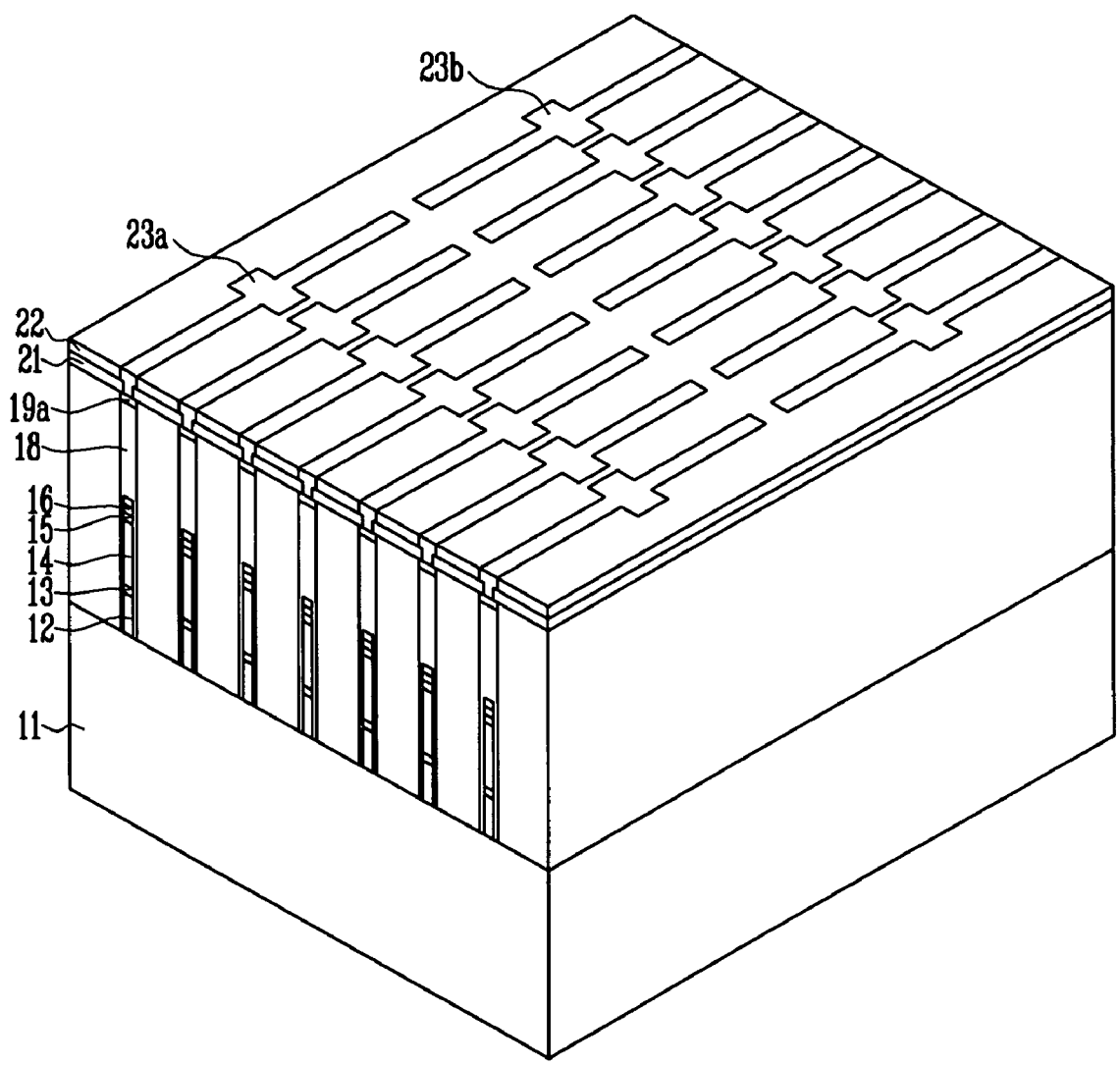
Figure 8:
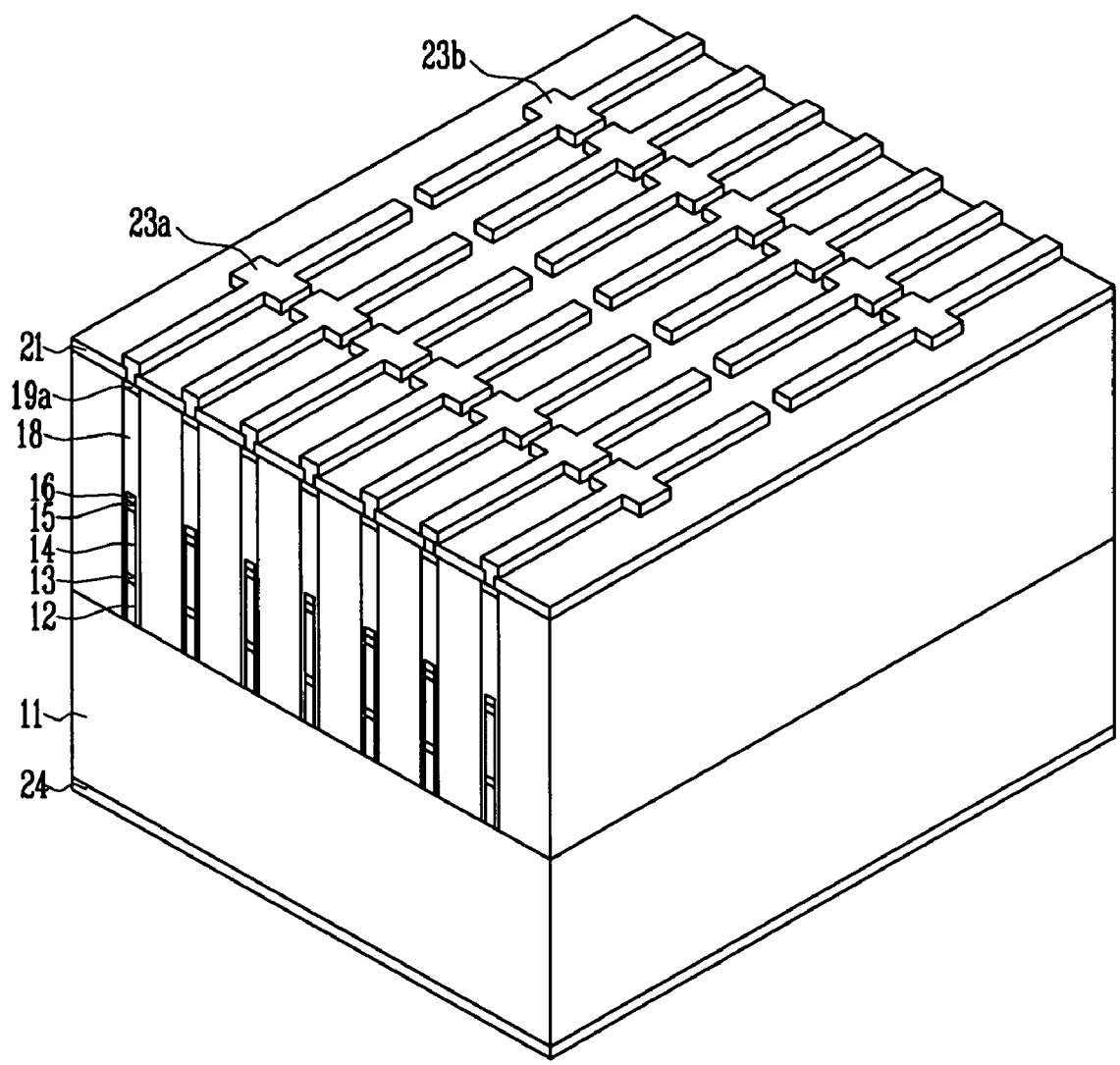

Referring to FIG. 7, after forming a photosensitive layer 22 on the entire surface of the resultant structure in order to form an electrode for current injection, a predetermined portion of the p-InGaAs ohmic contact layers 19a and 19b is exposed by an image reversal photolithography process. At this time, the stripe shaped p-InGaAs ohmic contact layers 19a and 19b are exposed to a width of about 20 µm, the predetermined portion including the p-InGaAs ohmic contact layers 19a and 19b is exposed to a width of about 200 μm to form an electrode pad.

When a P-type metal layer 23 is formed on the entire surface of the resultant structure using an electron beam deposition method and then the photosensitive layer 22 is removed, a P-type metal electrode 23a remains in the SOA region, and a P-type metal electrode 23b remains in the LD region. Then, an annealing process for ohmic contact is performed.

The bottom surface of the substrate 11 is lapped to a length of about 100 μm and a thickness of about 100 μm, and then an N-type metal layer 24 is formed on the bottom surface of the substrate 11. Thereafter, the annealing process is performed. The P-type metal layer 23 is formed of Au/Pt/Ti, and the N-type metal layer 24 is formed of Au/Cr. The P-type metal electrodes 23a and 23b and the N-type metal layer 24 are used as electrodes for current injection.

An anti-reflection layer is coated on an output surface of a semiconductor optical amplifier (SOA) of the completed optical device.

Figure 9A:
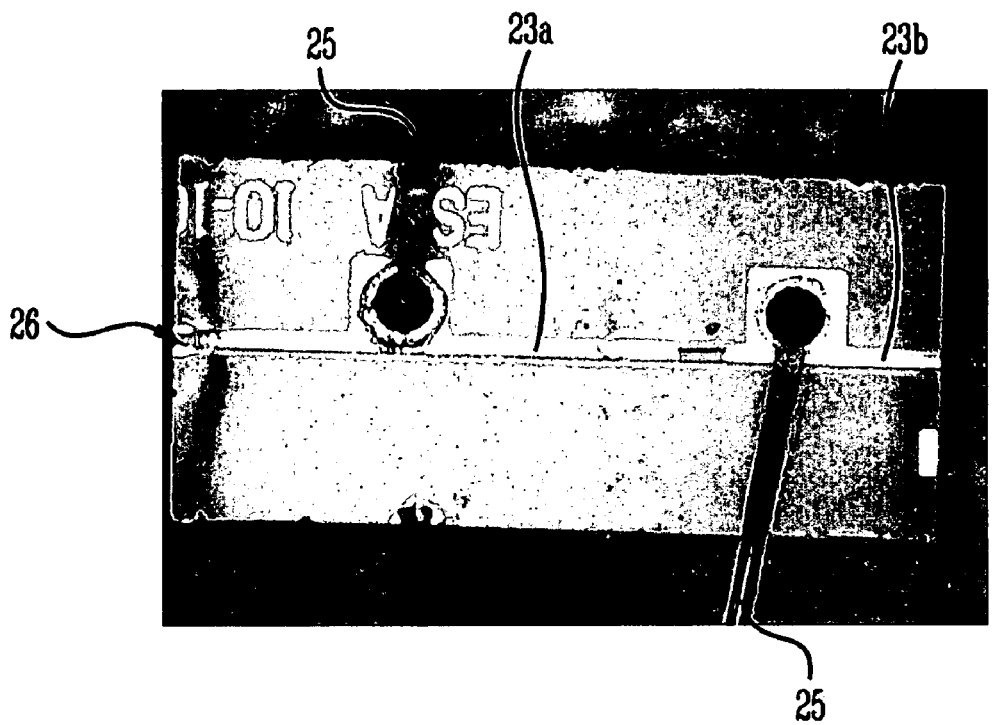
FIGS. 9A and 9B are photographs representing a bonding state of a semiconductor optical device in accordance with an exemplary embodiment of the present invention.
Figure 9B:
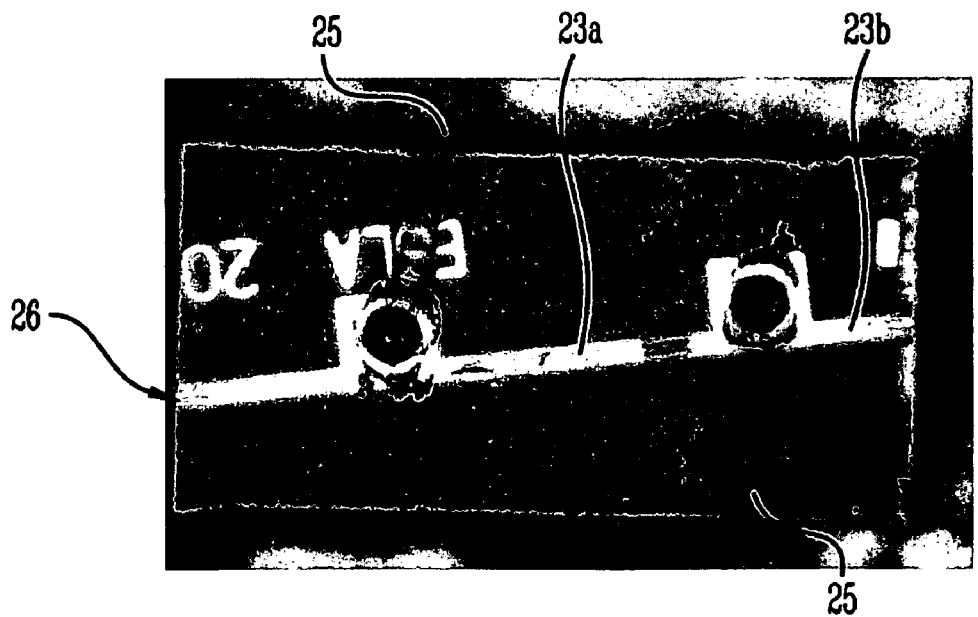

FIGS. 9A and 9B are photographs representing a wire-bonded state of the SOA and the LD after fabricating the optical device. A reference numeral 25 designates a wire, and a reference numeral 26 designates a coated light output surface.

The light output surface shows low oscillation start current and high light output characteristics in the case of a structure perpendicular to a resonant axis (FIG. 9A), and shows broadband light output spectrum characteristics in the case of a structure sloped to about 7° to the light output surface (FIG. 9B).

Figure 10:
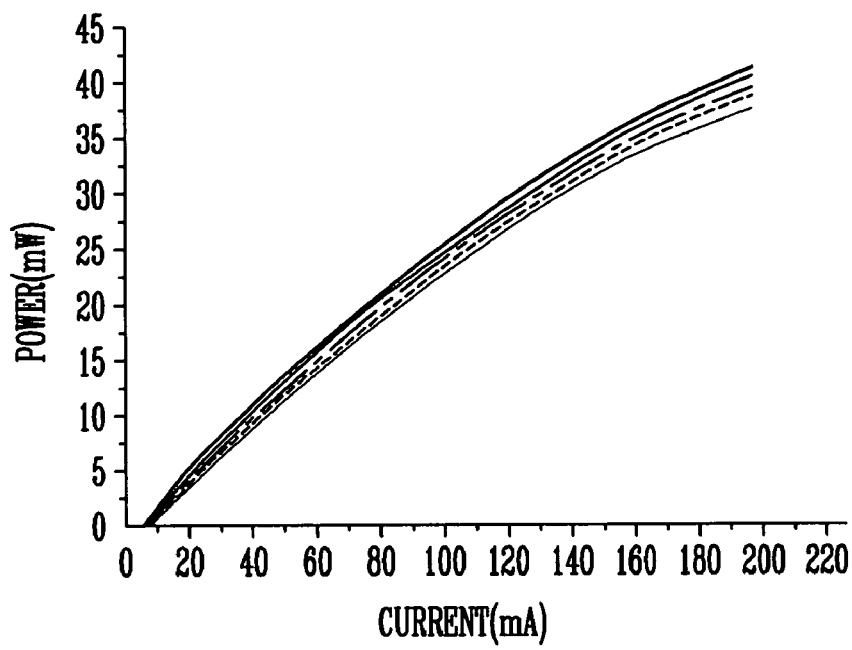
FIG. 10 is a graph representing current-light output characteristics of a semiconductor optical device in accordance with an exemplary embodiment of the present invention.

FIG. 10 is a graph representing current-light output characteristics of a semiconductor optical device in accordance with an exemplary embodiment of the present invention. In FIG. 10, when a CW current of 150 mA is injected in the state that 5 semiconductor optical devices are continuously arranged, the light output represents a value of not less than 30 mW.

Figure 11:
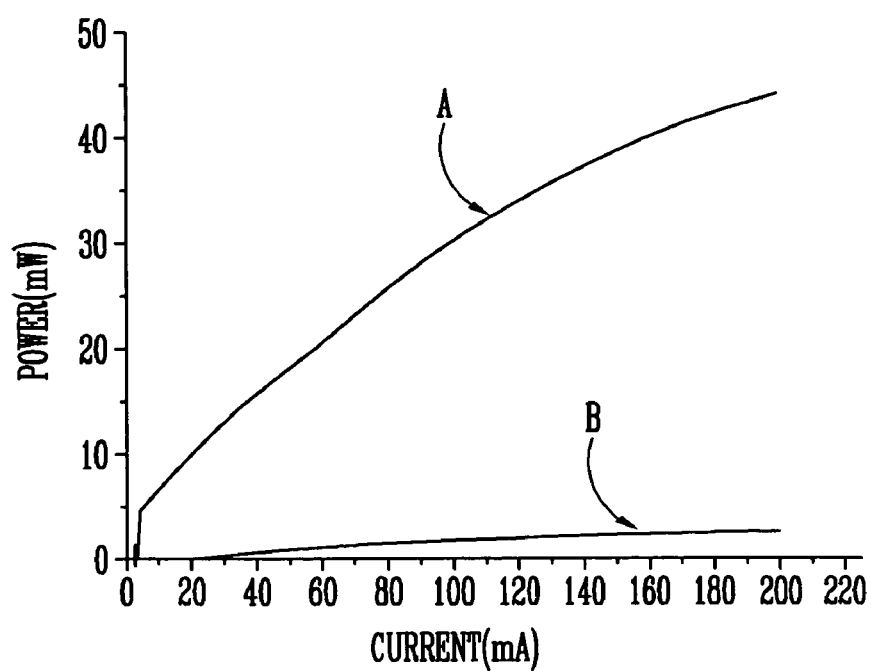
FIG. 11 is a graph representing optical amplifying characteristics of a semiconductor optical device in accordance with an exemplary embodiment of the present invention.
Figure 12:
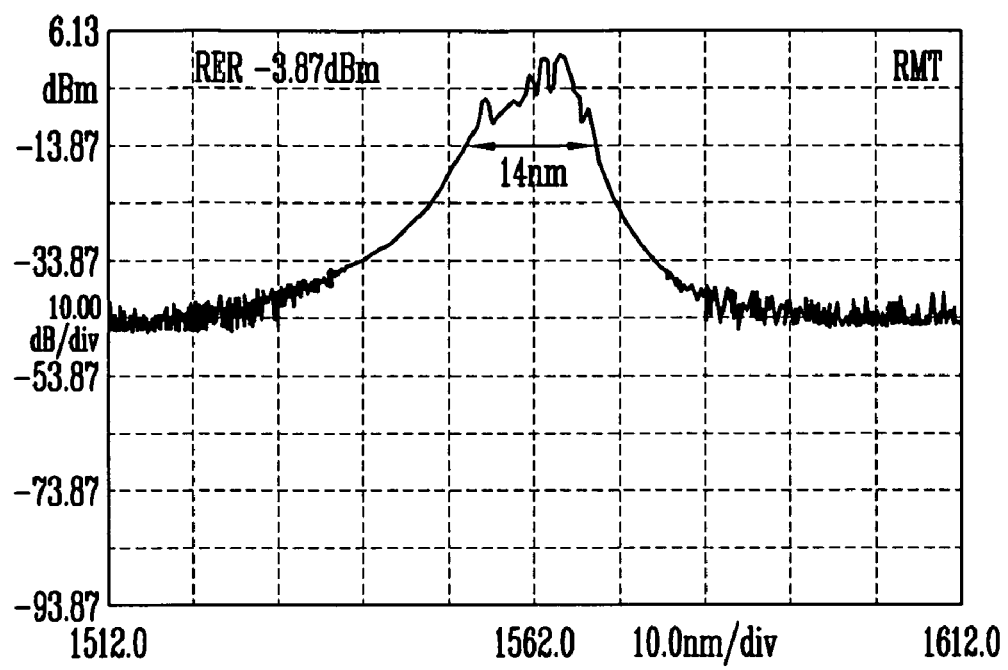
FIG. 12 is a light output spectrum of a semiconductor optical device in accordance with an exemplary embodiment of the present invention.

FIG. 11 is a graph representing optical amplifying characteristics of a semiconductor optical device in accordance with an exemplary embodiment of the present invention. In FIG. 11, a line A represents a light output in the case of gradually injecting current in the range from 0 to 200 mA to the electrode 23b of the SOA and injecting a current of 100 mA to the electrode 23b of the LD, and a line B represents a light output in the case of gradually injecting current in the range from 0 to 200 mA to only the electrode 23a of the SOA without driving the LD. In the case of driving the SOA only, the light output is not more than 3 mW when the current is injected by 200 mA, and a light output spectrum represents broadband output characteristics of a typical SOA as shown in FIG. 12. However, in the case of injecting a CW current of 100 mA to the electrode 23b of the LD, the oscillation start current has a low value of not more than 5 mA, and the light output has a high value of 45 mW at 200 mA. This is because the light generated from the LD is amplified by the SOA. In this case, the light output spectrum represents light output characteristics of not less than −5 dBm at a region of not less than 10 nm as shown in FIG. 12.

Figure 13A:
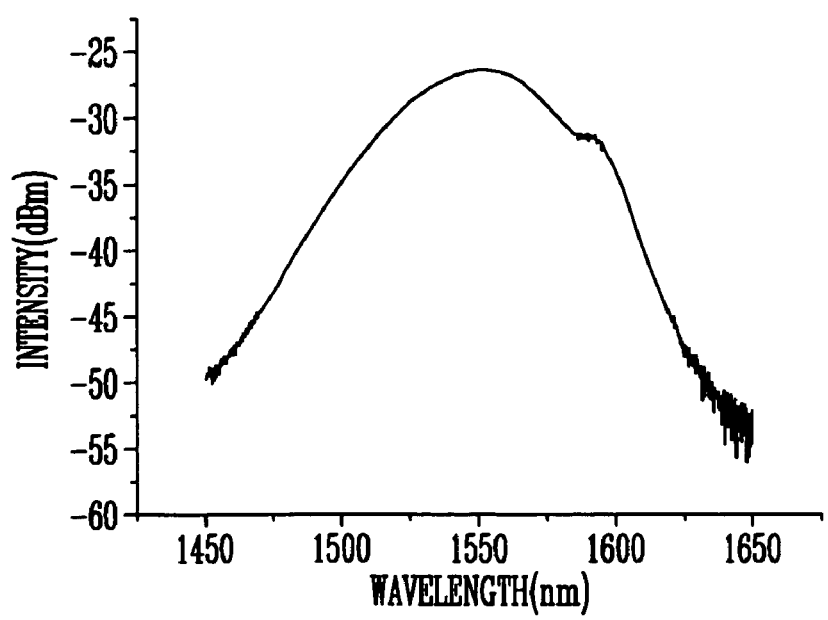
FIGS. 13A to 13C are light output spectra of a semiconductor optical device in accordance with an exemplary embodiment of the present invention.
Figure 13B:
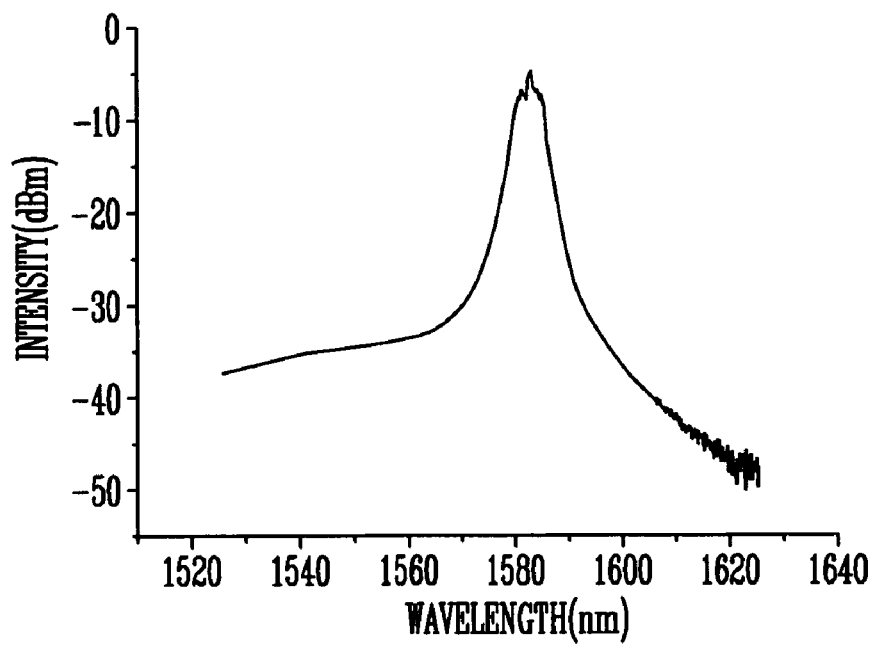
Figure 13C:
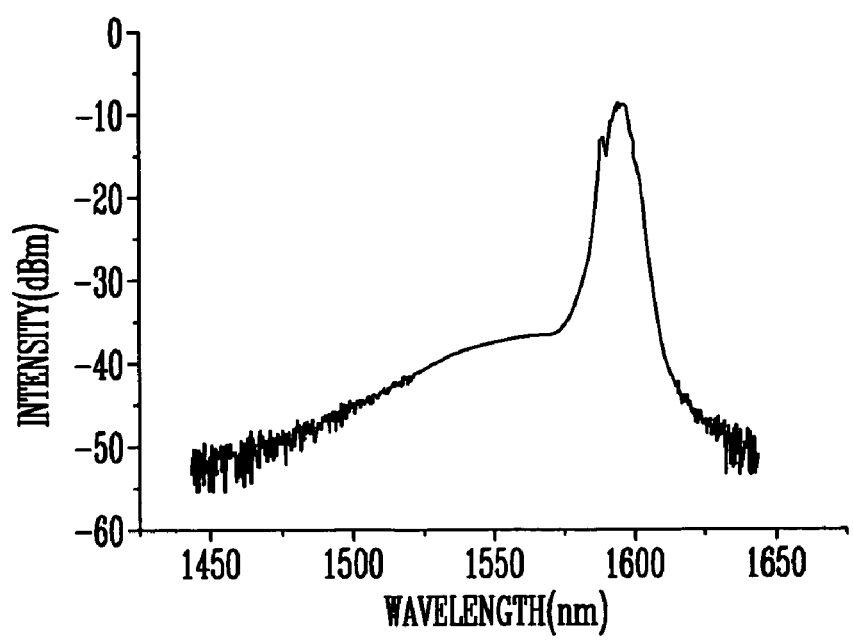

FIGS. 13A to 13C represent current-light output characteristics under 3 different conditions. FIG. 13A represents a light output spectrum in the case of injecting a current of 120 mA to the SOA without injecting current to the LD, and, FIGS. 13B and 13C represent light output spectra in the case of injecting currents of 40 mA and 80 mA to the LD, respectively.

As can be seen from the foregoing, the LD and the SOA of the present invention are integrated in the same active layer to be optically connected to each other and electrically insulated by ion injection so that the light generated from the LD is amplified by the SOA not less than 10 times, when the current is individually injected through each electrode.

Since the stripe shaped active layer has a structure sloped to the light output surface by about 7°, it is possible to use as a broadband light source having a wavelength of not less than 10 nm by operating the light output stage using the SOA. In addition, since the oscillation start current is low and the light output is high in the structure that the light output surface is perpendicular to a resonant direction, it can be used as a light source for a subscriber having excellent performance in comparison with the conventional FP-LD.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A method of fabricating a semiconductor optical device, comprising:
   after forming a buffer layer, an active layer and a passivation layer on a substrate, forming a plurality of first patterns having a stripe shape on a passivation layer;
   patterning the passivation layer, the active layer and the buffer layer using the first patterns as masks;
   forming a clad layer and an ohmic contact layer on an entire surface of the resultant structure, after removing the first pattern;
   forming a plurality of second patterns having a stripe shape on the ohmic contact layer of an optical amplifier region and a laser diode region, respectively;
   forming a current blocking layer on the ohmic contact layer and the clad layer of a portion exposed through an ion injection process using the second patterns as masks;
   removing the ohmic contact layer of a portion, in which ions are injected, after removing the second patterns, and forming an oxide pattern to expose the ohmic contact layer of a portion, in which ions are not injected;
   forming first metal electrodes on the exposed ohmic contact layer of the optical amplifier region and the laser diode region, respectively; and
   forming a second metal electrode on a bottom surface of the substrate.

2. The method according to claim 1, wherein the active layer includes a first separate confinement heterostructure (SCH) layer, a quantum well layer and a second separate confinement heterostructure (SCH) layer.

3. The method according to claim 2, wherein the quantum well layer is formed in a multi-layered structure that an unstrained InGaAsP barrier layer is inserted between InGaAsP strained well layers.

4. The method according to claim 1, wherein the passivation layer is formed of a p-InP layer.

5. The method according to claim 1, wherein the first pattern is formed perpendicularly to a light output surface of the optical amplifier or to have a predetermined angle of slope.

6. The method according to claim 5, wherein the predetermined angle is 5 to 10°.

7. The method according to claim 1, wherein the first pattern is formed of an oxide layer.

8. The method according to claim 1, wherein the clad layer is formed of a plurality of p-InP layers having different thicknesses and doping concentrations from each other.

9. The method according to claim 1, wherein the second pattern is formed of a photosensitive layer.

10. The method according to claim 1, wherein the current blocking layer is formed on the ohmic contact layer and the clad layer at a boundary between the optical amplifier region and the laser diode region during the ion injection process.

11. The method according to claim 1, further comprising etching the bottom surface of the substrate to a predetermined thickness before forming the second metal electrode.

12. The method according to claim 1, further comprising coating an anti-reflection layer on the light output surface of the optical amplifier after forming the second metal electrode.

* * * * *